SURFACE PROTECTION FOR TUNNELING SEMICONDUCTOR DEVICES
Original Filed Nov. 21, 1960
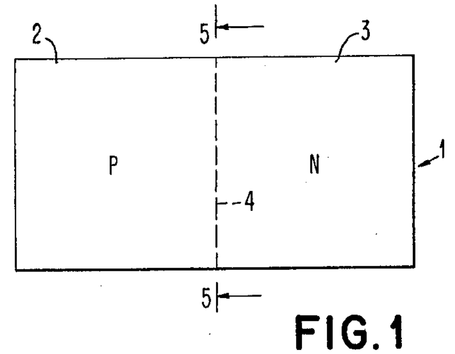
FIG.1
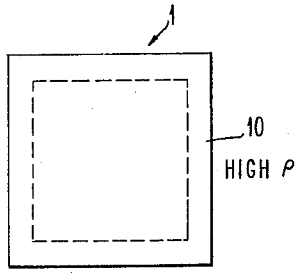
FIG.5
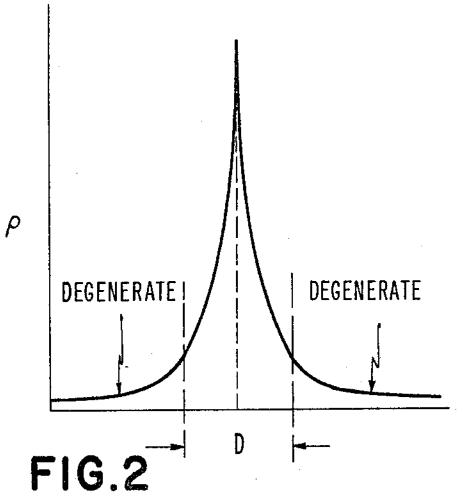
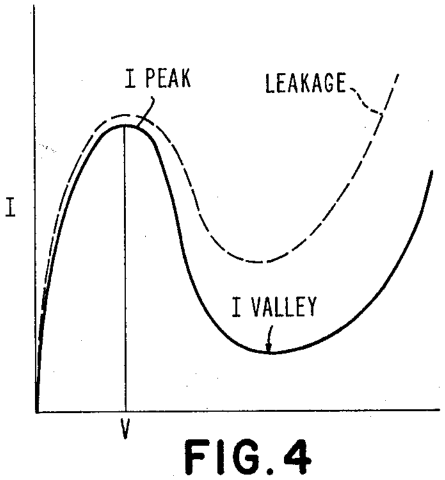
FIG.2 FIG.4
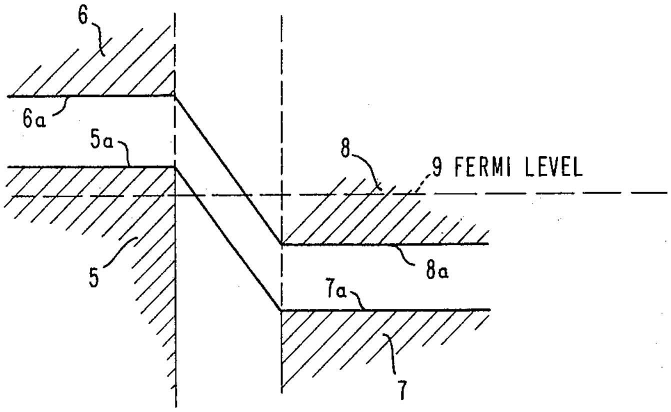
FIG.3
INVENTOR
FREDERICK H. DILL, JR
BY Thomas J. Kilgannon Jr
ATTORNEY

United States Patent Office 3,266,953

Patented August 16, 1966

3,266,953

SURFACE PROTECTION FOR TUNNELING SEMICONDUCTOR DEVICES

Frederick H. Dill, Jr., Putnam Valley, N.Y., assignor to International Business Machines Corporation, New York, N.Y., a corporation of New York

Continuation of application Ser. No. 70,561, Nov. 21, 1960. This application Jan. 20, 1964, Ser. No. 338,877
8 Claims. (Cl. 148—33.1)

This application is a continuation of my application Serial No. 70,561, filed November 21, 1960, now abandoned.

This invention relates to the surface protection of semiconductor devices; and, in particular, to the reduction of current leakage in semiconductor devices involving the phenomenon of quantum mechanical tunneling.

Semiconductor devices involving the phenomenon of quantum mechanical tunneling have been described in the art by Dr. Leo Esaki in the Physical Review, vol. 109, January 1958, pages 603–604 and one such device has come to be known in the art as the "Esaki" diode.

It has been established in the art that the criteria for the phenomenon of quantum mechanical tunneling is that there be in the semiconductor devices a "p-n" junction joining two regions of semiconductor material having very high conductivity. The conductivity of the regions is such that one region is degenerate and the other region approaches degeneracy such that under zero bias the conduction band on one side of the junction overlaps the valence band on the other side of the junction. Degeneracy may be defined as an impurity concentration sufficient to cause the Fermi level to lie within the valence or conduction band. In addition to these criteria, it is also necessary, since the phenomenon of quantum mechanical tunneling is based upon a probability of carrier energy, that the width of the "p-n" junction; that is, the distance in the crystal from the high conductivity region through intrinsic at the junction and back to the high conductivity value, be very small. In germanium, this distance is on the order of 150 Angstrom units or less. Semiconductor devices meeting these criteria exhibit a region of negative resistance at very low voltage levels.

As a result of the thin junction, in these devices the field associated with such junction is extremely high and a problem has existed in the art from current leakage across the thin junction at the surface of the device. Such leakage operates to interfere with the output characteristic of the device.

What has been discovered is a quantum mechanical tunneling junction semiconductor body having an inhomogeneity of impurity concentration over the surface of the junction so that the field present, where the junction is exposed at the surface of the body, is reduced.

It is an object of this invention to provide an improved quantum mechanical tunneling semiconductor structure.

It is another object of this invention to provide an improved Esaki or tunnel diode, having a reduced surface leakage.

It is still another object of this invention to provide an improved quantum mechanical tunneling device having reduced surface leakage.

It is another object of this invention to provide an improved technique for manufacturing quantum mechanical tunneling type semiconductor devices.

It is another object of this invention to provide an improved technique for manufacturing Esaki or tunnel diodes.

The foregoing and other objects, features and advantages of the invention will be apparent from the following more particular description of a preferred embodiment of the invention as illustrated in the accompanying drawings.

In the drawings:

FIG. 1 is a schematic view of a junction semi-conductor device.

FIG. 2 is a dimensionally correlated resistivity plot of the resistivity of the body of the semiconductor device of FIG. 1, necessary to produce quantum mechanical tunneling.

FIG. 3 is an energy diagram of a quantum mechanical tunneling type junction.

FIG. 4 is a voltage current output characteristic of the tunneling type junction of the device of FIG. 1.

FIG. 5 is an end view of the device of FIG. 1 illustrating a feature of the invention.

In accordance with the invention, the surface leakage of an quantum mechanical tunneling type junction can be substantially reduced by an increase in resistivity at the point where the junction reaches the surface of the semiconductor material.

Referring to FIG. 1, a semiconductor device 1 is shown having two regions 2 and 3 of "p" and "n" conductivity type, respectively, joined at "p-n" junction 4. This semiconductor structure may be a diode or a portion of a more involved semiconductor device, such as a transistor; and, the type of conductivity exhibited by the "p-n" junction 4 is governed by the quantity and type of conductivity type determining impurities predominating in the respective zones 2 and 3. The junction 4 is of the type capable of exhibiting quantum mechanical tunneling by meeting the requirements set forth in connection with FIGS. 2 and 3.

Referring next to FIG. 2, a resistivity plot is shown dimensionally correlated with the body of FIG. 1 to illustrate the requirements necessary to have the "p-n" junction 4 exhibit quantum mechanical tunneling type of performance. In the resistivity plot of FIG. 2, in the "p" region 2 there is a concentration of conductivity type determining impurities sufficient to produce degeneracy. For a particular example, in germanium this value is in the vicinity of $10^{19}$ impurity centers per cc. of semiconductor material. In the "n" region 3 of FIG. 1, there is a similar high concentration. In FIG. 2, in the region adjacent the "p-n" junction, the distance (D), which is the distance from the high concentration value of the "p" region through intrinsic to the high concentration value of the "n" region, is critical in quantum mechanical tunneling type devices; and, as has previously been explained, for a particular material, germanium, this distance is less than 150 Angstrom units.

Referring next to FIG. 3, a dimensionally correlated energy level diagram for the junction 4 of FIG. 1 is shown. In this diagram the "p" type material 2 has a valence band 5 with an upper edge *5a* and a conduction band 6 with a lower edge *6a*. The "n" type material similarly has a valence band 7 with an upper edge *7a* and a conduction band 8 with a lower edge *8a*. The edges *5a*–*6a* and *7a*–*8a* define the energy gap in the material. The Fermi level is shown by the line 9 and is within the valence band 5 of the "p" type material and the conduction band 8 of the "n" type material. It is essential to impart quantum mechanical tunneling characteristics to the junction 4 of FIG. 1 that the impurity concentration by sufficient that the conduction band of the "n" type material overlap the valence band of the "p" type material, as illustrated. Normally, the Fermi level will be within the valence band of the "p" type material and within the conduction band of the "n" type material. This width of the transition region across the junction must be maintained such that the probability, that carrier will tunnel across from the valence band of one material to the conduction band of the other, is sufficiently high. Since the probability varies exponentially with the distance (D), this transition region must, in order to maintain an operable probability, be kept very narrow.

When a semiconductor device, such as FIG. 1 has a junction meeting the criteria set forth in FIGS. 2 and 3, the junction will exhibit quantum mechanical tunneling, and will exhibit an output characteristic similar to the one shown by the solid curve in FIG. 4 wherein at an initial value of voltage, the current rises sharply as quantum mechanical tunneling across the overlapping portion of the valence and the conduction band of FIG. 3 takes place until at a particular value of voltage a first turn-over point will be observed in the output characteristic. This first turn-over point has come to be known in the art as the "peak current" and is so labelled on FIG. 4. Beyond the turn-over point, increases in voltage operate to change the relationship of the energy bands of FIG. 3 and the amount of tunneling current sharply reduces until a second turn-over point, known as the "valley current" is reached. This point is labelled "valley" in FIG. 4. Beyond the valley point, the applied voltage is such as to cause conduction by normal carrier injection, similar to normal forward current in a "p-n" junction rectifier. A measure of the quality of this device used in the art is the ratio of these turn-over points on the output characteristic. This ratio is known as the "peak to valley" ratio for the device.

A serious problem has existed in the art in that surface leakage as a result of the extremely high field produced by the narrow junction, will operate on an output characteristic, such as shown in FIG. 4, in a manner so that higher peak currents and higher valley currents are seen. This change is shown by a dotted curve in FIG. 4, labelled "leakage."

In accordance with the invention, it has been discovered that an inhomogeneity in the impurity concentration in the semiconductor material at the point where the junction reaches the surface of the material will operate to cause the bulk of the current flow to occur beneath the surface of the material and make a substantial reduction in the leakage thus yielding higher peak to valley ratios and simplifying the accurate reproduction of devices with identical output characteristics. This inhomogeneity of impurity concentration in the direction of raising the resistivity, is schematically illustrated in FIG. 5 which is a view of FIG. 1 along the junction 4, where the portion of region 2 at the surface 10 is of high resistivity and is labelled high $\rho$ down to a dotted line, whereas the center portion of the junction 4 is of lower resistivity. The dotted line in FIG. 5 is employed for illustration only since, in actual practice, a gradual resistivity change is likely and a definite line variation would not be apparent in most embodiments.

It has been found that a very small change in resistivity between the region 10 and the resistivity at the center of the junction 4 will produce a substantial change in performance; since, in a device of this nature the voltage levels are such that with a difference in resistivity, however small, essentially all the current will flow in the center of the junction and no appreciable current will flow at the surface.

In order to appreciate the practical differences between a quantum mechanical tunneling junction and a conventional semiconductor "p-n" junction, the change in resistivity 10 at that surface may be viewed in connection with FIG. 2 as a widening of the distance (D) at the surface, as would occur by raising the resistivity at the edges, since the tunneling is based on a probability of carriers getting through and this variation is a steep exponential, then a small change in resistivity will make a sharp change in probability of tunneling. In order to get a feel for the figures involved, in the semiconductor material, germanium, where the width D of FIG. 2 is 50 Angstrom units a substantial amount of tunneling takes place, but where the width D is expanded to beyond 150 Angstrom units, practically no tunneling takes place.

In order to place the values in proper perspective for one skilled in the art, it is believed that if the impurity density over the surface of the junction 4 of FIG. 1 is approximately $5\times10^{19}$, then a reduction in impurity density at the surface of the region 10 of FIG. 5 to a value of approximately $1\times10^{19}$ would be sufficient to confine essentially all tunneling current to a portion of the junction 4 beneath the surface. This terminology may be expressed in terms of resistivity as follows: For example, for "p" conductivity type germanium material, such as zone 2 of FIG. 1, where the resistivity of the bulk is 0.003 ohm/cm., a change in the region 10 at the surface from 0.003 to 0.03 ohm/cm. is sufficient. Similarly, for "n" conductivity type semiconductor material, such as zone 3 of FIG. 1, where the resistivity is 0.001, a change to 0.01 at the surface is sufficient.

It may be generally stated that the impurity concentration at the surface may be reduced as little as from $5\times10^{19}$ to $10^{19}$ impurity centers per cc. and still confine the tunneling current to the region within the bulk of the material. Preferably, the reduction is to the order of $10^{17}$ to $10^{15}$ impurity centers per cc.

In order to aid one skilled in the art in practicing the invention, the following methods of the formation of the structure of FIG. 1 are provided. A semiconductor body, for example, germanium, such as the region 3 of FIG. 1 is provided with approximately $5\times10^{19}$ atoms per cc. of a volatile conductivity type determining impurity such as arsenic, providing thereby a degenerate "n" conductivity type semiconductor body. The body is then placed in a vacuum of $10^{-7}$ mm./Hg and heated at a temperature of 600° C. for thirty minutes at which time the arsenic impurity concentration in the vicinity of the surface is reduced to approximately $10^{17}$ atoms per cc. An alloy connection of indium-gallium is then made to a surface of the body and the indium-gallium in segregating out of the alloy into the recrystallized region of the alloy connection will form a "p" region, such as 2 of FIG. 1 with a concentration sufficient to produce degenerate semiconductor material. The alloying technique characteristically provides an abrupt junction such that the distance D, of less than 150 Angstrom units for germanium, is maintained and the alloy connection is sufficiently small for a high tunneling probability within and is surrounded by the higher resistivity surface portion of the body.

Another method of providing the semiconductor device of the invention involves the epitaxial growth through the decomposition of a compound of a semiconductor material and a transport element. In this method, semiconductor material of high resistivity is epitaxially grown on a degenerate semiconductor crystal body of a first conductivity type. An opposite conductivity type alloy connection using standard techniques in the art is then made into the epitaxially grown semiconductor crystal to provide an abrupt "p-n" junction surrounded by the higher resistivity material.

What has been described is a technique of confining the tunneling current in a quantum mechanical tunneling type device to the bulk of the material beneath the surface so that surface leakage currents caused by the abnormally high field associated with the extremely thin junction of such a device are reduced and prevented from interfering with the output characteristic.

While the invention has been particularly shown and described with reference to a preferred embodiment thereof, it will be understood by those skilled in the art that various changes in form and details may be made therein without departing from the spirit and scope of the invention.

What is claimed is:

1. In an improved quantum mechanical tunneling device a semiconductor junction tunneling region the extent of which is limited by a region of the same conductivity type as one of the areas adjacent said junction and of higher resistivity.

2. In a quantum mechanical tunneling device a semiconductor junction tunneling region the extent of which is limited by a surrounding region of the same conductivity type as one of the areas adjacent said junction and of a higher resistivity.

3. An improved quantum-mechanical tunneling junction in a semiconductor device comprising a first region semiconductor material of a first conductivity type joining a second region of opposite conductivity type at a "p-n" junction said first and second regions each having a resistivity sufficiently low for quantum-mechanical tunneling and a tunneling current limiting region comprising a portion of at least one of said first and second regions having a resistivity higher than that which will support quantum-mechanical tunneling.

4. An improved quantum mechanical tunneling junction extending from the surface into a semiconductor body comprising: a first region of low resistivity degenerate semiconductor material of a first conductivity type; a second region of low resistivity approaching degeneracy, opposite conductivity type semiconductor material joining said first region at a narrow "p-n" junction in said semiconductor body and a portion of said semiconductor body formed from a region of same conductivity type material of higher resistivity in at least one region of said semiconductor body said portion including the surface of the semiconductor body where said "p-n" junction is exposed.

5. A quantum mechanical tunneling "p-n" junction device formed by adjacent regions of opposite conductivity type semiconductor wherein the "p-n" junction extends from the surface into the device, characterized by a protective region of higher than degenerate resistivity extending from a region of same conductivity type semiconductor material and bounding-on said "p-n" junction where it is exposed at said surface.

6. An improved quantum mechanical tunneling junction extending from the surface into a germanium semiconductor body comprising: a first region of low resistivity degenerate germanium semiconductor material of a first conductivity type; a second region of low resistivity approaching degeneracy, opposite conductivity type germanium semiconductor material joining said first region at a narrow "p-n" junction in said germanium semiconductor body and a portion of said germanium semiconductor body formed from a region of same conductivity type material of higher resistivity in at least one region of said germanium semiconductor body said portion including the surface of the germanium semiconductor body where said "p-n" junction is exposed.

7. An improved quantum mechanical tunneling junction extending from the surface into a germanium semiconductor body comprising: a first region of "p" conductivity type germanium semiconductor material forming a "p-n" junction with a second region of "n" conductivity germanium semiconductor material said "p-n" junction not exceeding 150 Angstrom units in width and having an impurity concentration of greater than $5\times10^{19}$ impurity centers per cc. beneath the surface and less than $10^{19}$ impurity centers per cc. of the same conductivity type as said first mentioned impurity concentration overlying said "p-n" junction.

8. A monocrystalline germanium semiconductor device comprising: a "p" conductivity region having a resistivity of 0.003 ohm/cm. in the bulk and a resistivity of 0.03 ohm/cm. at the surface thereof; joined at a "p-n" junction not exceeding 150 Angstrom units in width with an "n" conductivity type region having a resistivity of 0.001 ohm/cm. in the bulk and a resistivity of 0.01 ohm/cm. at the surface thereof.

References Cited by the Examiner

UNITED STATES PATENTS

| | | | |
|---|---|---|---|
| 3,007,090 | 10/1961 | Rutz | 148—33 |
| 3,033,714 | 5/1962 | Esaki | 148—1.5 X |
| 3,114,864 | 12/1963 | Sah | 317—234 |

DAVID L. RECK, *Primary Examiner.*

C. N. LOVELL, *Assistant Examiner.*